United States Patent [19]
Takeuchi et al.

[11] Patent Number: 5,733,670
[45] Date of Patent: Mar. 31, 1998

[54] ZIRCONIA DIAPHRAGM STRUCTURE, METHOD OF PRODUCING THE SAME, AND PIEZOELECTRIC/ELECTROSTRICTIVE FILM ELEMENT HAVING THE ZIRCONIA DIAPHRAGM STRUCTURE

[75] Inventors: Yukihisa Takeuchi, Aichi-ken; Hideo Masumori, Anjo; Katsuyuki Takeuchi; Tsutomu Nanataki, both of Nagoya, all of Japan

[73] Assignee: NGK Insulators, Ltd., Japan

[21] Appl. No.: 524,042

[22] Filed: Sep. 6, 1995

Related U.S. Application Data

[62] Division of Ser. No. 321,912, Oct. 12, 1994, Pat. No. 5,517,076.

[30] Foreign Application Priority Data

Oct. 14, 1993 [JP] Japan .................... 5-257297
Jun. 29, 1994 [JP] Japan .................... 6-148320

[51] Int. Cl.⁶ ............................................ C04B 35/64
[52] U.S. Cl. ......................... 428/699; 264/63; 156/89
[58] Field of Search .................... 264/58, 63; 156/89

[56] References Cited

U.S. PATENT DOCUMENTS

| | | | |
|---|---|---|---|
| 4,525,464 | 6/1985 | Claussen et al. | 501/103 |
| 4,894,635 | 1/1990 | Yajima | 338/2 |
| 5,089,455 | 2/1992 | Ketcham et al. | 501/104 |
| 5,517,076 | 5/1996 | Takeuchi | 310/358 |
| 5,526,112 | 6/1996 | Sahagen | 356/72 |

FOREIGN PATENT DOCUMENTS

| | | |
|---|---|---|
| 0468796 | 1/1992 | European Pat. Off. . |
| 0526048 | 2/1993 | European Pat. Off. . |
| 0572230 | 12/1993 | European Pat. Off. . |
| 62-213399 | 9/1987 | Japan . |
| 2161647 | 1/1986 | United Kingdom . |

*Primary Examiner*—Timothy Speer
*Attorney, Agent, or Firm*—Parkhurst & Wendel

[57] ABSTRACT

A zirconia diaphragm structure, and a method of producing such structure. The zirconia diaphragm structure includes a zirconia substrate having at least one window, and a zirconia diaphragm plate formed integrally with the zirconia substrate so as to close each window, the zirconia substrate comprising a zirconia material as a major component, and containing 0.1–5.0% by weight of one of combinations consisting of (i) alumina and calcia, (ii) alumina, calcia and magnesia, (iii) alumina, calcia and silica, and (iv) alumina, calcia, magnesia and silica.

6 Claims, 4 Drawing Sheets

ZIRCONIA DIAPHRAGM STRUCTURE, METHOD OF PRODUCING THE SAME, AND PIEZOELECTRIC/ELECTROSTRICTIVE FILM ELEMENT HAVING THE ZIRCONIA DIAPHRAGM STRUCTURE

This is a Division of application Ser. No. 08/321,912 filed Oct. 12, 1994 now U.S. Pat. No. 5,517,076.

BACKGROUND OF THE INVENTION

1. Field of the Invention

The present invention relates to a zirconia diaphragm structure, a method of producing the same, and a piezoelectric/electrostrictive film element including the zirconia diaphragm structure. In particular, the invention is concerned with such a diaphragm structure having a thin zirconia diaphragm that is free of buckling, cracks and other defects, and a method of producing the diaphragm structure, and is also concerned with a high-quality piezoelectric/electrostrictive film element including such a zirconia diaphragm structure.

2. Discussion of Related Art

A diaphragm structure having a substrate or base with at least one window or opening formed therethrough, and a thin diaphragm plate formed of a flexible material so as to close the window or windows, has been widely used for various kinds of sensors. In recent years, this diaphragm structure has been increasingly used for piezoelectric/electrostrictive actuators. When the diaphragm structure is used as a component of a sensor, the sensor has appropriate means for detecting the amount of bending or flexural displacement of a diaphragm of the diaphragm structure, which displacement is caused by an object (e.g., voltage) to be measured by the sensor. When the diaphragm structure is used as a component of a piezoelectric/electrostrictive actuator, the diaphragm of the diaphragm structure is deformed or deflected by a piezoelectric/electrostrictive element formed on the diaphragm. For example, the actuator utilizes a change in the pressure in a pressure chamber formed within the diaphragm structure.

The diaphragm structure as described above may be produced by forming an integral body consisting of the substrate serving as a base or support, and a film member which is supported by the substrate and which provides the diaphragm. For improved operating reliability, and increased heat resistance and corrosion resistance, the diaphragm structure is desirably formed as a fired integral ceramic body, as proposed in U.S. Pat. No. 4,894,635 (corresponding to JP-A-63-292032) owned by the assignee of the present application, and co-pending U.S. patent application Ser. No. 08/239,856 (corresponding to JP-A-5-29675) assigned to the present assignee. These documents disclose a piezoelectric/electrostrictive film element in the form of a fired integral body of a ceramic material, which is used for a pressure sensor and a piezoelectric/electrostrictive actuator.

The integral ceramic diaphragm structure as described above is generally formed by laminating a ceramic green substrate having a window with a thin ceramic green sheet for closing the window, to thus form an integral green laminar ceramic body having a diaphragm portion which closes the window at one of the opposite open ends of the window. The green laminar ceramic body is then fired into the integral diaphragm structure. The inventors of the present invention found that the thus prepared diaphragm structure tends to suffer from buckling or cracking at the diaphragm portion. The buckling and cracking at the diaphragm portion are detrimental to the intended function or operation of the diaphragm, resulting in reduced operating reliability.

SUMMARY OF THE INVENTION

It is therefore a first object of the present invention to provide a zirconia diaphragm structure which is free from buckling, cracking and other physical defects at its diaphragm portion and which assures improved operating reliability.

It is a second object of the present invention to provide a method suitable for producing such a diaphragm structure.

It is a third object of the invention to provide a piezoelectric/electrostrictive film element using the diaphragm structure as described above, in particular, a piezoelectric/electrostrictive film element having an excellent quality.

The first object of the invention may be attained according to one aspect of the present invention, which provides a zirconia diaphragm structure comprising: a zirconia substrate having at least one window and containing 0.1–5.0% by weight of one of combinations consisting of (i) alumina and calcia, (ii) alumina, calcia and magnesia, (iii) alumina, calcia and silica, and (iv) alumina, calcia, magnesia and silica; a zirconia diaphragm plate formed integrally with the zirconia substrate so as to close each window of the zirconia substrate, at an open end of each window. The diaphragm plate includes at least one diaphragm portion which corresponds to the above-indicated at least one window.

The first object may also be attained according to another aspect of the present invention, which provides a zirconia diaphragm structure comprising a zirconia substrate having at least one window, and a zirconia diaphragm plate formed integrally with the zirconia substrate so as to close each window at an open end of the window, the zirconia diaphragm structure being produced by a method comprising the steps of: preparing a zirconia green substrate having at least one window and containing a source material which gives, after firing of the zirconia green substrate, 0.1–5.0% by weight of one of combinations consisting of (i) alumina and calcia, (ii) alumina, calcia and magnesia, (iii) alumina, calcia and silica, and (iv) alumina, calcia, magnesia and silica; forming a zirconia green sheet on the zirconia green substrate, to provide an integral green laminar structure in which the window or windows of the zirconia green substrate is closed by the zirconia green sheet; and firing the integral green laminar structure into an integral sintered body in the form of the zirconia diaphragm structure wherein the zirconia diaphragm plate formed by firing of the zirconia green sheet provides at least one diaphragm portion which closes the window or windows of the zirconia substrate formed by firing of the zirconia green substrate.

In the zirconia diaphragm structure constructed or produced as described above according to the present invention, the diaphragm portion or portions closing the window or windows of the substrate is/are free from buckling, cracking and other defects. Thus, the present diaphragm structure has improved quality and enhanced operating reliability.

In one preferred form of the invention, the zirconia substrate and zirconia diaphragm plate are principally formed of partially stabilized zirconia or a material which is fired into partially stabilized zirconia. In this instance, the fired zirconia substrate and the diaphragm plate exhibit high physical or mechanical strength, and high degrees of heat resistance and corrosion resistance, and the diaphragm plate can be made sufficiently thin, exhibiting high flexibility. Thus, the present diaphragm structure has a wide range of applications.

The above-described second object may be attained according to a further aspect of the present invention, which provides a method of producing a zirconia diaphragm structure comprising a zirconia substrate having at least one window, and a zirconia diaphragm plate closing each window at an open end of the window, the method comprising the steps of: (a) preparing a zirconia green substrate having at least one window and containing a source material which gives, after firing of the green substrate, 0.1–5.0% by weight of one of combinations consisting of (i) alumina and calcia, (ii) alumina, calcia and magnesia, (iii) alumina, calcia and silica, and (iv) alumina, calcia, magnesia and silica; (b) preparing a zirconia green sheet; (c) laminating the thin zirconia green sheet on the zirconia green substrate, to provide an integral green laminar structure in which the at least one window of the zirconia green substrate is closed by the zirconia green sheet; and (d) firing the integral green laminar structure into an integral sintered body in the form of the zirconia diaphragm structure wherein the zirconia diaphragm plate formed by firing the zirconia green sheet provides at least one diaphragm portion which closes the at least one window of the zirconia substrate formed by firing the zirconia green substrate.

The zirconia green sheet and zirconia green substrate may be formed of a zirconia material which comprises partially stabilized zirconia or which is fired into partially stabilized zirconia. Preferably, the zirconia material for the zirconia green sheet has an average particle size which is smaller than that of the second zirconia material for the zirconia green substrate. For example, the zirconia material for the zirconia green sheet preferably has an average particle size of 0.05–0.5 μm, and the zirconia material for the zirconia green substrate preferably has an average particle size of 0.1–1.0 μm. The thickness of the zirconia green sheet may be determined so that the above-indicated at least one diaphragm portion has a thickness of not larger than 30 μm.

The third object of the invention may be attained according to a still further aspect of the present invention, which provides a piezoelectric/electrostrictive film element comprising a zirconia diaphragm structure and at least one piezoelectric/electrostrictive unit formed on the zirconia diaphragm structure, the zirconia diaphragm structure including a zirconia substrate having at least one window, and a zirconia diaphragm plate formed integrally with the zirconia substrate so as to close each window at an open end of the each window, each of the above-indicated at least one piezoelectric/electrostrictive unit including a lower and an upper electrode and a piezoelectric/electrostrictive layer interposed between the lower and upper electrodes, the piezoelectric/electrostrictive film element being produced by a method comprising the steps of: (a) preparing a zirconia green substrate having at least one window and containing a source material which gives, after firing of the zirconia green substrate, 0.1–5.0% by weight of one of (i) alumina and calcia, (ii) alumina, calcia and magnesia, (iii) alumina, calcia and silica, and (iv) alumina, calcia, magnesia and silica; (b) forming a zirconia green sheet on the zirconia green substrate, to provide an integral green laminar structure in which the at least one window of the zirconia green substrate is closed by the zirconia green sheet; (c) firing the integral green laminar structure into an integral sintered body in the form of the zirconia diaphragm structure wherein the zirconia diaphragm plate formed by firing of the zirconia green sheet provides at least one diaphragm portion which closes the window or windows of the zirconia substrate formed by firing of the zirconia green substrate; and (d) forming, by a film-forming method, each piezoelectric/electrostrictive unit on an outer surface of the corresponding diaphragm portion of the zirconia diaphragm plate of the zirconia diaphragm structure.

In the thus constructed piezoelectric/electrostrictive film element, the zirconia substrate and zirconia diaphragm plate of the diaphragm structure are preferably formed principally of partially stabilized zirconia or a material which is fired into partially stabilized zirconia.

Since the diaphragm structure of the above-described piezoelectric/electrostrictive film element is free from buckling and cracking at the diaphragm portion or portions, the film element has significantly improved operating reliability, and can therefore be advantageously used for various actuators, display devices, sensors, microphones, sounding bodies (such as loudspeakers), and various resonators or oscillators for power devices and communication devices.

BRIEF DESCRIPTION OF THE DRAWINGS

The above and optional objects, features and advantages of the present invention will be better understood by reading the following detailed description of a presently preferred embodiment of the invention, when considered in connection with the accompanying drawings, in which.

DETAILED DESCRIPTION OF THE PREFERRED EMBODIMENT

Figure 1:
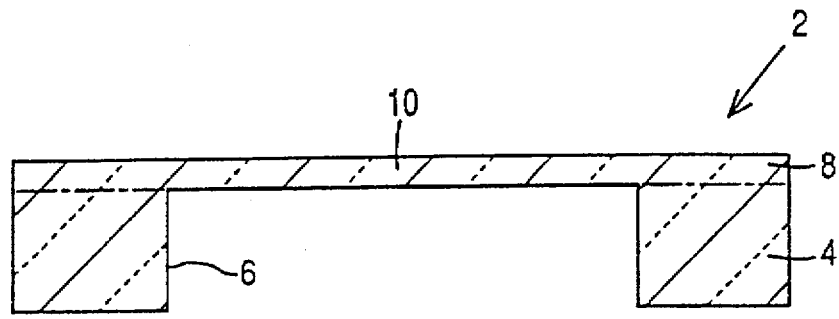
FIG. 1 is a cross sectional view showing one embodiment of a zirconia diaphragm structure of the present invention.
Figure 2:
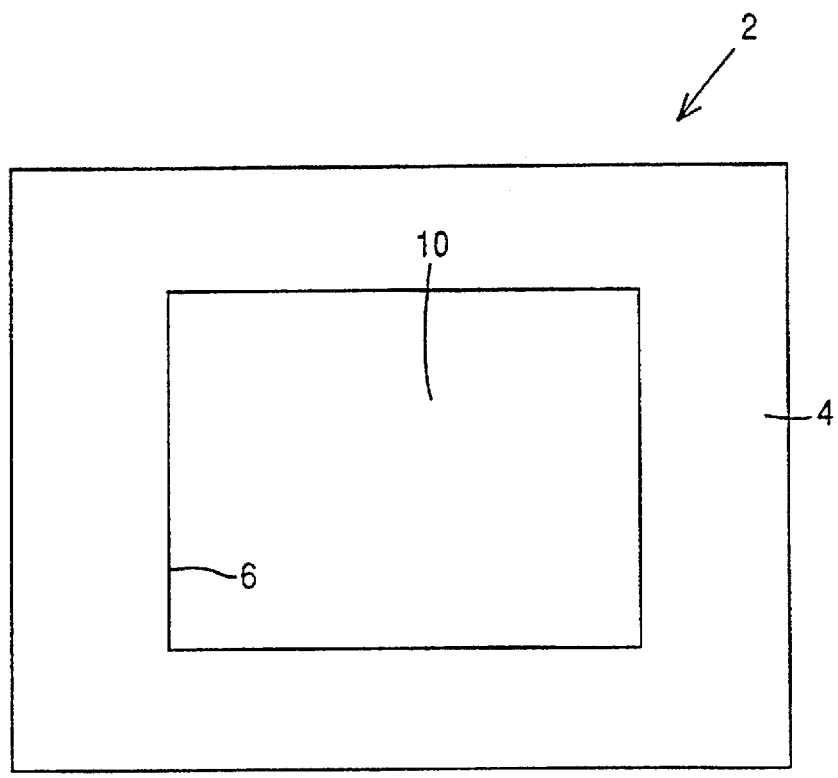
FIG. 2 is a bottom plan view of the diaphragm structure of FIG. 1.

As described above, the zirconia diaphragm structure is formed by firing an integral laminar structure consisting of a zirconia green substrate which provides a zirconia substrate or base having a window or windows, and a thin zirconia green sheet whose inner part serves as a diaphragm portion that closes one of opposite open ends of each window of the substrate. According to the present invention, a particular substance(s) or material(s) is/are added to the zirconia green substrate, which is then fired integrally with the thin zirconia green sheet, so as to provide the zirconia diaphragm structure which is free from buckling and/or cracks that would otherwise occur in the diaphragm portion. Referring to FIGS. 1 and 2, there will be described in detail an example of the diaphragm structure constructed according to the principle of the present invention. This embodiment has one window formed through the thickness of the zirconia substrate.

Figure 3:
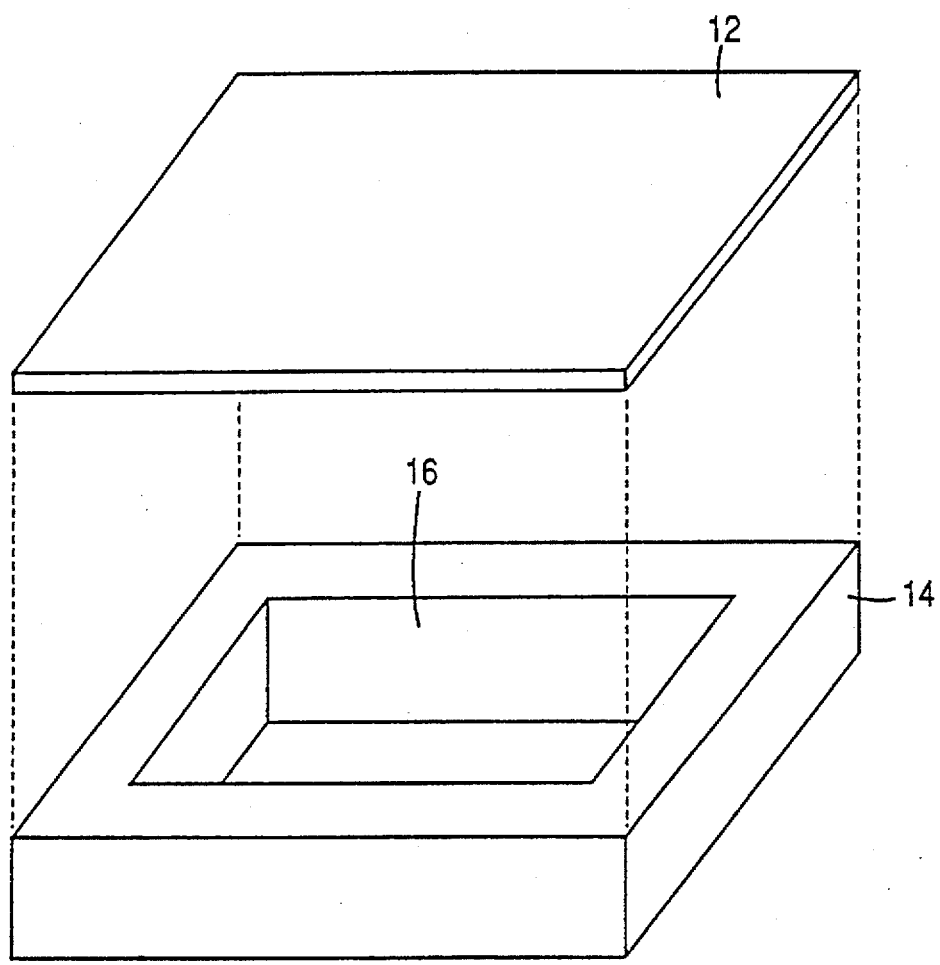
FIG. 3 is a perspective view illustrating a step in the process of producing the diaphragm structure of in FIG. 1.

As shown in FIGS. 1 and 2, an integrally formed diaphragm structure 2 consists of a zirconia substrate or base 4 which has a rectangular window or opening 6 of a suitable size, and a thin zirconia diaphragm plate 8 which is superposed on one of opposite major surfaces of the zirconia substrate 4, so as to close one of the opposite open ends of the window 6. The thus formed diaphragm structure 2 has an inner diaphragm portion 10 which is aligned with the window 6 of the zirconia substrate 4, as viewed in the plane of the structure 2. To produce this diaphragm structure 2, a thin zirconia green sheet 12 which gives the zirconia diaphragm plate 8 is superposed on a zirconia green substrate 14 which gives the zirconia substrate 4, as shown in FIG. 3, thereby to form an integral green laminar structure, which is then fired into the integral diaphragm structure 2. The zirconia green sheet 12 and/or the zirconia green substrate 14 may be formed by laminating a plurality of sheets or substrates having a smaller thickness value. It is to be understood that the shape of the window 6 of the diaphragm structure 2, in other words, the shape of the diaphragm portion 10 is by no means limited to the rectangular shape as in the present embodiment, but may be suitably selected depending upon the application of the diaphragm structure 2. For example, the diaphragm portion 10 may have a circular, polygonal or elliptical shape, or a combination of such different shapes.

The zirconia green sheet 12 and zirconia green substrate 14 which cooperate to give the present diaphragm structure 2 are both formed of a known zirconia material. The use of zirconia is advantageous since the obtained diaphragm structure 2 exhibits high degrees of physical strength, heat resistance and corrosion resistance, and the diaphragm portion 10 can be formed with a sufficiently small thickness and shows high flexibility. These properties may be further enhanced when the green sheet 12 and green substrate 14 are formed of partially stabilized zirconia whose crystal phase is partially stabilized by a suitable compound, or formed of a material that is fired into a partially stabilized zirconia.

The term "partially stabilized zirconia" used herein means zirconia the crystal phase of which is partially stabilized by addition of a single compound or a mixture of compounds, so that only a part of the zirconia undergoes phase transformation when the zirconia is subject to heat, stress or the like. The compound or compounds for partially stabilizing zirconia may be selected from yttrium oxide, cerium oxide, magnesium oxide, calcium oxide and others. The amount of addition of these compounds is preferably determined such that (a) yttrium oxide amounts to 2–7 mole % of the material for the green sheet or substrate, (b) cerium oxide amounts to 6–15 mole % of the green sheet or substrate material, and (c) magnesium oxide or calcium oxide amounts to 5–12 mole % of the green sheet or substrate material. Among these compounds, it is particularly preferable to use yttrium oxide as a partially stabilizing agent in an amount of 2–7 mole %, more preferably in an amount of 2–4 mole %. By the addition of yttrium in an amount in the above range, the primary crystal phase of the zirconia is partially stabilized to provide the tetragonal system or a combination of two or three systems selected from the cubic, tetragonal and monoclinic systems. The zirconia thus partially stabilized assures excellent characteristics of the resultant diaphragm structure. While it is desirable that the diaphragm plate 8 of the diaphragm structure 2 is formed entirely of the partially stabilized zirconia, not more than 10% by weight of an additive or a sintering aid may be added as needed to the zirconia material for the diaphragm plate 8. Likewise, the zirconia material for the zirconia substrate 4 may contain such additive or aid, to the extent that the additive does not reduce the above-described effects or advantages of the partially stabilized zirconia used.

It is desirable that the partially stabilized zirconia material or the material that is fired to give the partially stabilized zirconia, for forming the zirconia green sheet 12 and zirconia green substrate 14, has a suitably selected grain size so as to achieve the object of the present invention. Explained more specifically, the zirconia green sheet 12 is desirably formed of a partially stabilized zirconia material or a material giving partially stabilized zirconia by firing thereof, which has the average particle size of 0.05–0.5 µm, preferably, 0.1–0.3 µm. The zirconia green substrate 14 is desirably formed of a partially stabilized zirconia material or a material giving partially stabilized zirconia by firing thereof, which has the average particle size of 0.1–1.0 µm, preferably, 0.3–0.6 µm. Preferably, the average particle size of the material for the zirconia green sheet 12 is determined to be smaller than that of the material for the zirconia green substrate 14.

By suitably selecting the average particle sizes of the respective materials for the zirconia green sheet 12 and zirconia green substrate 14 as described above, these green sheet and substrate 12, 14 can be favorably fired into an integral structure, without buckling or cracking taking place in the inner diaphragm portion 10, to thus provide the diaphragm structure 2 having excellent properties, such as increased strength of the diaphragm portion 10. If the average particle size of the partially stabilized zirconia material or the material that is fired to give the partially stabilized zirconia is smaller than the lower limits specified above, it would be difficult to form the green sheet 12 and green substrate 14 without cracking of the sheets 12, 14 due to increased chronological changes of slurries used to form the sheets. As a result, the obtained diaphragm structure 2, when used for sensors or actuators, suffers from undesirably low operating stability. If the average particle size of the materials for the zirconia green sheet 12 and green substrate 14 is larger than the upper limits specified above, the substrate 4 and diaphragm portion 10 of the obtained diaphragm structure 2 have reduced strength, and are likely to suffer from buckling, cracking and other defects.

The zirconia green sheet 12 and zirconia green substrate 14 having suitable thickness are formed in a manner known in the art, by adding a suitable binder or organic solvent to the respective zirconia materials for the green sheet and substrate 12, 14 so as to form slurries or pastes. According to the present invention, the zirconia material for the zirconia green substrate 14 contains one of the following combinations of source materials for additional components: an alumina source material and a calcia source material; an alumina source material, a calcia source material, and a magnesia source material; an alumina source material, a calcia source material and a silica source material; and an alumina source material, a calcia source material, a magnesia source material and a silica source material. The alumina source material, calcia source material, magnesia source material and silica source material give alumina, calcia, magnesia and silica, respectively, to the fired zirconia substrate 4 formed by firing the green substrate 14. The amounts of these source materials are determined so that the total amount of the additional components, that is, alumina and calcia, or alumina, calcia and magnesia and/or silica, is held in the range of 0.1–5.0% by weight. The use of the zirconia green substrate 14 containing one of the above-indicated combination of the source materials is advantageous since the firing of the integral green laminar structure consisting of the zirconia green sheet 12 and green substrate 14 can be effected such that the sintering condition (sintering speed) and sintering characteristics of the green sheet 12 are approximated or made similar to those of the green substrate 14, so as to effectively avoid buckling and cracking at the diaphragm portion 10 of the thus obtained diaphragm structure 2.

The amount of addition of the source materials (alumina source material and calcia source material, or alumina source material, calcia source material and magnesia source material and/or silica source material) to the zirconia green substrate 14 should be sufficient to assure the above-described effects offered by the addition of such source material. If the content of the source materials in the zirconia green substrate 14 is excessive, however, the sintering speed of the zirconia green substrate 14 is adversely influenced, with a result of wrinkling, buckling and other defects occurring in the diaphragm portion 10. Accordingly, the total amount of the source materials contained in the zirconia green substrate 14 should be controlled so that the zirconia substrate 4 formed by firing the green substrate 14 contains: an alumina component and a calcia component in a total amount of 0.1–5.0% by weight, preferably, 0.5–3.0% by weight, if the alumina source material and calcia source material are used; an alumina component, a calcia component, a magnesia component in a total amount of 0.1–5.0% by weight, preferably 0.5–3.0% by weight, if the alumina source material, calcia source material and magnesia source material are used; an alumina component, a calcia component, a silica component in a total amount of 0.1–5.0% by weight, preferably, 0.3–3.0% by weight, if the alumina source material, calcia source material and silica source material are used; or an alumina component, a calcia component, a magnesia component and a silica component in a total amount of 0.1–5.0% by weight, preferably, 0.3–3.0% by weight, if the alumina source material, calcia source material, magnesia source material and silica source material are used. When the alumina source material and the calcia source material are used along with the magnesia source material and/or the silica source material, it is desirable that the content of each of alumina and calcia be at least 1%, preferably at least 10% of the total content of the components given by the above-indicated source materials. When the diaphragm structure is used for a piezoelectric/ electrostrictive film element, the alumina source material and calcia source material, or the alumina source material, calcia source material and magnesia source material are preferably used to assure better piezoelectric properties of the element.

Among the source materials as indicated above, the alumina source material may be selected from among: alumina; inorganic aluminum compounds such as aluminum chloride and aluminum nitrate; organic aluminum compounds such as aluminum alkoxide and aluminum acetylacetonate. The magnesia source material and the calcia source material are preferably added in the form of compounds other than oxides, since magnesium oxides and calcium oxides have undesirably high hygroscopic property. For example, the magnesia/calcia source material is favorably selected from among inorganic magnesium/calcium compounds such as carbonate, nitrate and chloride, and organic magnesium/calcium compounds such as alkoxide and acetylacetonate. The silica source material may be selected from among: silica powder; inorganic silicon compounds such as silica gel and silicon chloride; organic silicon compounds such as silicon alkoxide and silicon phenoxide. While the above-indicated source materials are added independently so as to provide the corresponding components, i.e., alumina, calcia, magnesia and silica in the above case, it is also possible to add a single source material in the form of a compound so as to provide two or more of the above components. For example, the alumina and silica components may be given by addition of a single source material that is selected from clays such as kaolin and kibushi clay, and mullite. Further, cordierite may be added as a source material for the alumina, silica and magnesia components, and spinel may be added as a source material for the alumina and magnesia components. Also may be added calcium silicate as a source material for the calcia and silica components.

To form the zirconia green sheet 12 and zirconia green substrate 14 used to produce the present zirconia diaphragm structure 2, green sheets are first formed by a generally used machine, such as a doctor blade machine or a reverse roll coater, using slurries or pastes which are prepared from the above-indicated materials by an ordinary method. If necessary, a plurality of thin green sheets may be laminated or stacked together, or initially prepared green sheets may be cut, machined, punched or otherwise processed, to provide the green sheet and substrate 12, 14 having desired thicknesses and shapes. In preparing the slurries or pastes for the green sheets, phthalic esters such as dioctyl phthalate and dibutyl phthalate may be used as a plasticizer, and a dispersing agent such as sorbitan mono-oleate and sorbitan laurate may be used, as well known in the art. Further, the slurries or pastes include a solvent, such as toluene, xylene or alcohol. The thickness values of the thus obtained zirconia green sheet 12 and zirconia green substrate 14 are suitably determined depending upon desired thickness values of the zirconia diaphragm plate 8 and zirconia substrate 4 of the diaphragm structure 2. More specifically, the thickness of the diaphragm portion 10 as part of the diaphragm plate 8 is desirably held in a range of 1 µm to 30 µm, preferably in a range of 3 µm to 15 µm, so as to effectively prevent buckling, cracking or the like in the diaphragm portion 10. Therefore, the thickness of the zirconia green sheet 12 is determined so that the thickness of the diaphragm plate 8 does not exceed 30 µm. The thickness of the zirconia green substrate 14 is determined so that the zirconia substrate 4 obtained by firing the green substrate 14 generally has a thickness of at least 50 µm, preferably at least 100 µm.

The thus prepared zirconia green sheet 12 and zirconia green substrate 14 are superposed on each other by an ordinary method, and stacked together into an integral green laminar structure by means of thermo-compression bonding, for example. Thereafter, the laminar structure is fired at a temperature of about 1200°–1600° C., preferably 1300°–1500° C., to form the diaphragm structure 2 in the form of an integral sintered body. The firing of the laminar structure is effected under substantially the same conditions (including the firing temperature) as conventionally employed for firing zirconia materials.

The zirconia diaphragm structure 2 thus obtained according to the present invention is free from buckling, cracking and other defects at the diaphragm portion 10 thereof, assuring excellent quality and high operating reliability, and can be thus advantageously used for various applications, such as sensors and actuators. Further, the present zirconia diaphragm structure 2 can make use of advantageous properties of zirconia, that is, high mechanical strength, high degrees of heat resistance and corrosion resistance, and high flexibility when used with small thickness. Therefore, the zirconia diaphragm structure 2 can be favorably used as a part of a device, a conduit or the like which requires high corrosion resistance, together with various detecting means such as a strain gauge, so as to provide a corrosion-resistant pressure sensor adapted to monitor the internal pressure or other parameter of the device or conduit. The present diaphragm structure 2 can also be used with a suitable driving source, such as air pressure or a push rod, to provide an actuator which provides a relatively large amount of displacement at a relatively low frequency.

In particular, the zirconia diaphragm structure of the present invention can be advantageously used for various sensors, and for a piezoelectric/electrostrictive film device in which a piezoelectric/electrostrictive unit is formed on one of opposite major surfaces of the diaphragm portion of the diaphragm structure. Described more particularly, the present diaphragm structure can be favorably used for various uni-morph, bi-morph or other types of piezoelectric/electrostrictive film actuators which undergo displacement in the form of bending, deflection or flexture. Such piezoelectric/electrostrictive film actuators include, for example, servo-displacement elements, pulse-driven motors and ultrasonic motors, as described in "FUNDAMENTALS TO APPLICATIONS OF PIEZOELECTRIC/ELECTROSTRICTIVE ACTUATORS", Kenji Uchino, Japan Industrial Technology Center. The present diaphragm structure can be also used for display devices, acceleration sensors, shock sensors, microphones, sounding bodies (such as loudspeakers) and various resonators or vibrators for power devices and communication devices.

Figure 4:
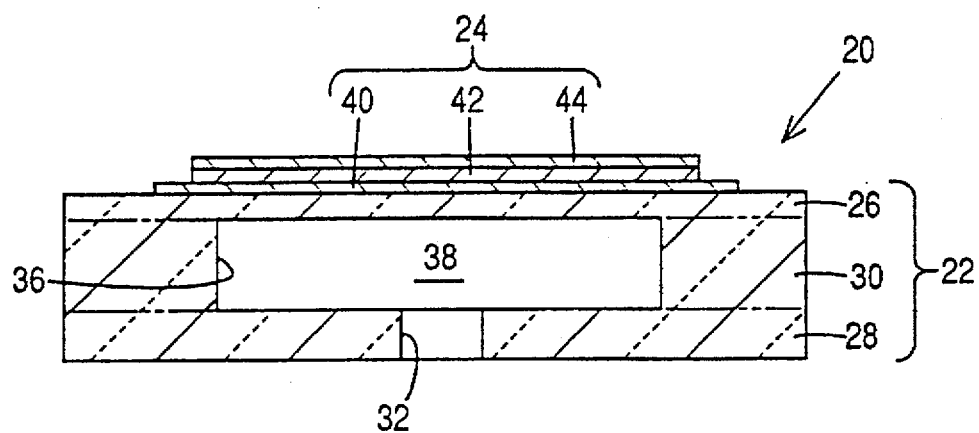
FIG. 4 is a cross sectional view showing an example of a piezoelectric/electrostrictive film element using the zirconia diaphragm structure of the present invention.
Figure 5:
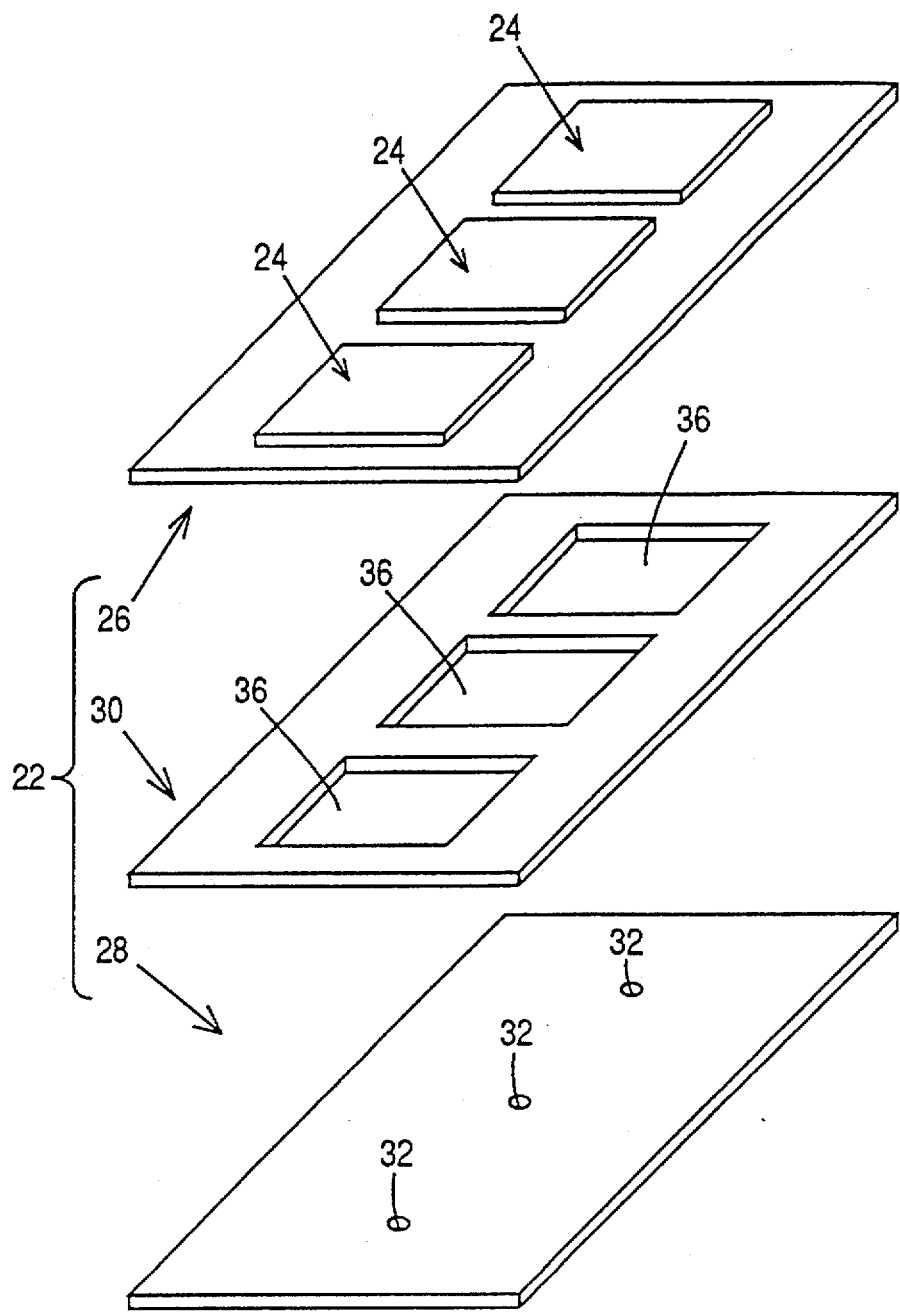
FIG. 5 is an exploded perspective view of the piezoelectric/electrostrictive film element of FIG. 4.

FIG. 4 schematically shows one example of the piezoelectric/electrostrictive film element 20, which uses one embodiment of the zirconia diaphragm structure of the present invention, and FIG. 5 is an exploded perspective view of this film element 20. The element 20 has a diaphragm structure 22 to which there are integrally bonded a plurality of piezoelectric/electrostrictive units 24. Each unit 24 is formed on respective portions of the outer surface of the diaphragm portion of the diaphragm structure 22. The piezoelectric/electrostrictive units 24 are adapted to cause deflection or deformation of the corresponding parts of the diaphragm portion of the diaphragm structure 22, upon application of a voltage to the units 24.

Described in detail, the diaphragm structure 22 constructed according to the present invention has a laminar structure which consists of a thin closure plate 26 and a connecting plate 28 each formed of a zirconia material, and a spacer plate 30 formed of a zirconia material and interposed between the closure and connecting plates 26, 28. The connecting plate 28 has a plurality of communication holes 32 (three holes 32 in this example), which are spaced apart from each other by a predetermined distance in the longitudinal direction of the plate 28, as shown in FIG. 5. These communication holes 32 communicate with an external space. The spacer plate 30 has a plurality of rectangular windows 36 (three windows 36 in this example) formed therethrough. The windows 36 are spaced apart from each other by a predetermined distance in the longitudinal direction of the spacer place 30. The spacer plate 30 is superposed on the connecting plate 28 such that the windows 36 are held in communication with the respective communication holes 32 of the connecting plate 28. While only one communication hole 32 is provided for each of the windows 36, a desired number of communication holes 32 may be provided for each window 36, depending upon the application of the piezoelectric/electrostrictive film element 20. The closure plate 26 is superposed on one of the opposite major surfaces of the spacer plate 30 remote from the connecting plate 28, so as to cover or close the windows 36 of the spacer plate 30. In this arrangement, pressure chambers 38 are formed within the diaphragm structure 22 such that the pressure chambers 38 are held in communication with the space outside the structure 22, through the respective communication holes 32.

As described above, the diaphragm structure 22 is formed as an integral sintered body made principally of zirconia. To produce the diaphragm structure 22, green sheets are initially formed by a generally used machine such as a doctor blade machine, reverse roll coater or screen printing machine, using slurries or pastes that are prepared from suitable zirconia materials, a binder and a solvent, for example. Then, the green sheets are subjected to cutting, machining, punching or other process as needed, so as to form the windows 36 and the communication holes 32 and thus provide precursors which give the respective plates 26, 28, 30. Then, these precursors are laminated on each other, and fired into the integral diaphragm structure 22.

The piezoelectric/electrostrictive units 24 are formed on the outer surface of the closure plate 26 of the diaphragm structure 22, such that the units 24 are aligned with the respective pressure chambers 38, as viewed in the plane parallel to the outer surface of the closure plate 26. Each of the piezoelectric/electrostrictive units 24 includes a lower electrode 40, a piezoelectric/electrostrictive layer 42 and an upper electrode 44, which are formed in lamination in the order of description on the closure plate 26 by a suitable film-forming method. For the piezoelectric/electrostrictive units 24, it is particularly preferable to employ a piezoelectric/electrostrictive element as proposed in co-pending U.S. patent application Ser. No. 08/239,856 assigned to the assignee of the present patent application, which corresponds to JP-A-5-29675.

The upper and lower electrode films 44, 40 and the piezoelectric/electrostrictive layer 42 of each piezoelectric/electrostrictive unit 24 are formed on the outer surface of the closure plate 26 of the diaphragm structure 22 as an integral sintered body, by any one of various known methods including thick-film forming methods such as screen printing, spraying, dipping and coating, and thin-film forming methods such as ion-beam method, sputtering, vacuum vapor deposition, ion plating, CVD and plating. The materials used for forming the electrode films 40, 44 and piezoelectric/electrostrictive layer 42 may be suitably selected from various known materials and those materials as disclosed in the above-identified U.S. Patent Application. The thickness of the piezoelectric/electrostrictive unit 24 consisting of the electrode films 40, 44 and the piezoelectric/electrostrictive layer 42 is generally 100 µm or smaller. Generally, the thickness of each electrode film 40, 44 is 20 µm or smaller, preferably 5 µm or smaller. To assure a relatively large amount of relative flexural displacement of the diaphragm portion of the diaphragm structure 22, the thickness of the piezoelectric/electrostrictive layer 42 is preferably 50 µm or smaller, more preferably in the range of 3 µm to 40 µm.

In the thus constructed piezoelectric/electrostrictive film element 20 wherein the piezoelectric/electrostrictive units 24 are integrally formed on the diaphragm portion of the closure plate 26 of the zirconia diaphragm structure 22, the diaphragm portion of the closure plate 26 undergoes oscillation or flexural displacement due to the piezoelectric or electrostrictive effect of each piezoelectric/electrostrictive unit 24 upon application of a voltage thereto, whereby the pressure of a fluid within the pressure chambers 38 can be changed so as to effect flow or delivery of the fluid from the respective pressure chambers 38 as needed.

As described above, the zirconia diaphragm structure constructed according to the present invention may be suitably used as a component of a piezoelectric/electrostrictive film element, and may also be used as a component of various other devices such as display devices, piezoelectric microphones, piezoelectric loudspeakers, sensors, oscillators, resonators, filters, and transformers. The construction of the piezoelectric/electrostrictive film element is not limited to the details of the film element 20 described above for illustrative purpose only, but may be changed or modified as needed for use as a component of various actuators.

[EXAMPLES]

To further clarify the present invention, there will be described in detail some examples of diaphragm structures that may be used for the piezoelectric/electrostrictive film element 20 shown in FIGS. 4 and 5. It is to be understood that the present invention is not limited to the details of the following examples, but may be embodied with various changes, modifications and improvements, which may occur to those skilled in the art, without departing from the scope of the present invention. In the following description of the examples, parts and percentage representing the contents of various materials are based on weight, unless otherwise specified.

Initially, some specimens of zirconia materials were prepared to form some examples of the diaphragm structure 22 used for the piezoelectric/electrostrictive film element 20 shown in FIGS. 4 and 5. Zirconia used for each specimen was partially stabilized by 3 mol % of yttria, and the specimens had respective average particle sizes as indicated in TABLE 1 and TABLE 2 below. The zirconia materials for the spacer and connecting plates 30, 28 contained source materials which give after firing thereof predetermined amounts of additional components (alumina, silica, magnesia and calcia) as indicated in TABLE 1 and TABLE 2, in addition to the partially stabilized zirconia. The alumina component was added by coprecipitating alumina and zirconia, and the calcia component, silica component and magnesia component were added by mixing respective source materials in the form of calcium carbonate ($CaCO_3$) powder, quartz powder and magnesium carbonate ($MgCO_3$) powder, with the partially stabilized zirconia to form respective slurries, so that desired amounts of the additional components were contained in the fired spacer and connecting plates 30, 18. The calcium carbonate and magnesium carbonate were added so that the contents of CaO and MgO were controlled to the respective values as indicated in TABLE 1 and TABLE 2.

Subsequently, green sheets having various thickness values were formed by an ordinary method, using the above-described specimens of the zirconia materials, and

TABLE 1

| | Closure plate (26) | | | | Spacer plate (30) · Connecting plate (28) | | | | | | |
|---|---|---|---|---|---|---|---|---|---|---|---|
| | Parti-cle | Binders (Parts | | Thick-ness | Parti-cle | Additional Components (% by weight) | | | | Thickness (μm) | |
| No. | size (μm) | by weight) | Firing ratio | (μm) | size (μm) | Alumina | Silica | Magnesia | Calcia | Spacer plate | Connect-ing plate |
| 1 | 0.1 | 17.0 | 1.27 | 5 | 0.3 | 0.2 | 0 | 0 | 0.1 | 150 | 150 |
| 2 | 0.1 | 17.0 | 1.27 | 5 | 0.3 | 0.5 | 0 | 0 | 0.6 | 150 | 150 |
| 3 | 0.1 | 17.0 | 1.27 | 8 | 0.3 | 1.0 | 0 | 0 | 1.0 | 150 | 150 |
| 4 | 0.1 | 17.0 | 1.27 | 8 | 0.3 | 2.0 | 0 | 0 | 2.0 | 150 | 150 |
| *5 | 0.1 | 17.0 | 1.27 | 8 | 0.3 | 4.0 | 0 | 0 | 4.0 | 150 | 150 |
| *6 | 0.1 | 17.0 | 1.27 | 8 | 0.3 | 0.03 | 0 | 0 | 0.03 | 150 | 150 |
| 7 | 0.3 | 17.0 | 1.27 | 10 | 0.5 | 0.03 | 0 | 0.1 | 0.03 | 150 | 150 |
| 8 | 0.3 | 17.0 | 1.27 | 10 | 0.5 | 0.5 | 0 | 0.5 | 0.5 | 150 | 150 |
| 9 | 0.3 | 17.0 | 1.27 | 10 | 0.5 | 1.0 | 0 | 1.0 | 1.0 | 150 | 150 |
| *10 | 0.3 | 17.0 | 1.27 | 10 | 0.5 | 2.0 | 0 | 3.0 | 3.0 | 150 | 150 |
| 11 | 0.2 | 17.0 | 1.29 | 13 | 0.3 | 0.04 | 0.04 | 0 | 0.04 | 100 | 300 |
| 12 | 0.2 | 17.0 | 1.26 | 13 | 0.3 | 0.1 | 0.1 | 0 | 0.1 | 100 | 300 |
| 13 | 0.2 | 17.0 | 1.27 | 13 | 0.3 | 0.5 | 0.5 | 0 | 0.5 | 100 | 300 |
| 14 | 0.2 | 17.0 | 1.27 | 13 | 0.3 | 2.0 | 0.5 | 0 | 2.0 | 100 | 300 |
| *15 | 0.2 | 17.0 | 1.27 | 13 | 0.3 | 2.0 | 2.0 | 0 | 2.0 | 100 | 300 |
| *16 | 0.2 | 17.0 | 1.27 | 13 | 0.3 | 0.02 | 0.02 | 0 | 0.02 | 100 | 300 |

*Comparative Examples
Note)
The total amount of the binders added to the material for the spacer plate and connecting plate was 13.4 parts by weight, and the firing ratio of these plates was 1.25.

TABLE 2

| | Closure plate (26) | | | | Spacer plate (30) · Connecting plate (28) | | | | | | |
|---|---|---|---|---|---|---|---|---|---|---|---|
| | Parti-cle | Binders (Parts | | Thick-ness | Parti-cle | Additional Components (% by weight) | | | | Thickness (μm) | |
| No. | size (μm) | by weight) | Firing ratio | (μm) | size (μm) | Alumina | Silica | Magnesia | Calcia | Spacer plate | Connect-ing plate |
| 17 | 0.3 | 17.0 | 1.27 | 15 | 0.6 | 0.03 | 0.03 | 0.03 | 0.03 | 200 | 100 |
| 18 | 0.3 | 17.0 | 1.27 | 15 | 0.6 | 0.1 | 0.1 | 0.1 | 0.1 | 200 | 100 |
| 19 | 0.3 | 17.0 | 1.27 | 15 | 0.6 | 0.6 | 0.2 | 1.0 | 1.0 | 200 | 100 |
| 20 | 0.3 | 17.0 | 1.27 | 15 | 0.6 | 1.0 | 1.0 | 1.0 | 2.0 | 200 | 100 |
| *21 | 0.3 | 17.0 | 1.27 | 15 | 0.6 | 2.0 | 2.0 | 1.0 | 1.0 | 200 | 100 |

TABLE 2-continued

| | Closure plate (26) | | | Spacer plate (30) · Connecting plate (28) | | | | | | |
|---|---|---|---|---|---|---|---|---|---|---|
| | Particle | Binders (Parts | | Thick- | Particle | Additional Components | | | | Thickness (μm) |
| | size | by | Firing | ness | size | (% by weight) | | | | Spacer | Connect- |
| No. | (μm) | weight) | ratio | (μm) | (μm) | Alumina | Silica | Magnesia | Calcia | plate | ing plate |
| *22 | 0.05 | 17.0 | 1.27 | 10 | 0.1 | 0 | 0 | 0 | 0 | 150 | 150 |
| *23 | 0.3 | 17.0 | 1.27 | 12 | 0.3 | 0 | 0 | 0 | 0 | 150 | 150 |
| *24 | 0.3 | 18.5 | 1.29 | 12 | 0.3 | 0 | 0 | 0 | 0 | 150 | 150 |
| *25 | 0.3 | 15.5 | 1.26 | 12 | 0.3 | 0 | 0 | 0 | 0 | 150 | 150 |

*Comparative Examples
Note)
The total amount of the binders added to the material for the spacer plate and connecting plate was 13.4 parts by weight, and the firing ratio of these plates was 1.25.

the green sheets thus formed were then subjected as needed to cutting, machining, punching and other process, so as to form the closure plate 26, connecting plate 28 and spacer plate 30 used for forming the diaphragm structure 22 for the piezoelectric/electrostrictive film element 20 as shown in FIGS. 4 and 5. As binders for forming the green sheets, a polyvinyl butyral resin, a plasticizer containing ester phthalate, and a dispersing agent containing sorbitan were added in a total amount of 13.4–18.5 parts per 100 parts of the zirconia material. As solvents, toluene and isopropyl alcohol were used in the proportion of 50:50 (by volume). Each combination of the closure plate 26, spacer plate 30 and connecting plate 28 as shown in TABLE 1 and TABLE 2 was used to form an integral green laminar structure, which was then fired at 1400° C. to provide the intended diaphragm structure 22 having eight windows 36. The term "firing ratio" indicated in TABLE 1 and TABLE 2 means a value obtained by dividing the dimensions of the each plate (26, 28, 30) before firing by the dimensions of the same after firing at 1400° C. without lamination of the plates (26, 28, 30).

Each of the thus obtained examples of the diaphragm structure 22 was tested so as to measure the amount of buckling, if any, at a portion of the closure plate 26 which closes one of the eight windows 36. The examples were also checked for cracking. The test result is indicated in TABLE 3 below, in which "LARGE", "MEDIUM" and

TABLE 3

| | Buckling | Cracking |
|---|---|---|
| 1 | SMALL | NOT FOUND |
| 2 | VS-N | NOT FOUND |
| 3 | VS-N | NOT FOUND |
| 4 | SMALL | NOT FOUND |
| *5 | MEDIUM | NOT FOUND |
| *6 | MEDIUM | NOT FOUND |
| 7 | SMALL | NOT FOUND |
| 8 | VS-N | NOT FOUND |
| 9 | VS-N | NOT FOUND |
| *10 | MEDIUM | NOT FOUND |
| 11 | SMALL | NOT FOUND |
| 12 | VS-N | NOT FOUND |
| 13 | VS-N | NOT FOUND |
| 14 | VS-N | NOT FOUND |
| *15 | MEDIUM | NOT FOUND |
| *16 | MEDIUM | NOT FOUND |
| 17 | SMALL | NOT FOUND |
| 18 | VS-N | NOT FOUND |
| 19 | VS-N | NOT FOUND |
| 20 | SMALL | NOT FOUND |

TABLE 3-continued

| | Buckling | Cracking |
|---|---|---|
| *21 | MEDIUM | NOT FOUND |
| *22 | LARGE | NOT FOUND |
| *23 | MEDIUM | NOT FOUND |
| *24 | SMALL | FOUND*[1] |
| *25 | LARGE | NOT FOUND |

VS-N: Very small or almost none
*Comparative Examples
*[1]The buckling was measured at the non-cracked diaphragm portion of the closure plate 26.

"SMALL" respectively indicate the buckling amounts of at least 50 μm (LARGE), 15 μm–50 μm (MEDIUM), and 10 μm–15 μm (SMALL), while "VS-N" (VERY SMALL-NONE) represents the buckling amount of 0–10 μm. The specimens were checked for cracking at eight local diaphragm portions of the closure plate 26 which close the respective eight windows 36.

It will be apparent from the result of the above test that the addition of the source material(s) to give at least one of additional components, i.e., alumina ($Al_2O_3$), calcia (CaO), silica ($SiO_2$) and magnesia (MgO) to the zirconia materials for the spacer plate 30 and the connecting plate 28 is effective to reduce the amount of buckling of the thin diaphragm portions of the diaphragm structure 22, or eliminate the buckling, and avoid cracking of the diaphragm portions. Thus, the diaphragm structure 22 constructed according to the present invention exhibits high operating reliability at its diaphragm portions, and can be produced with high efficiency.

What is claimed is:

1. A method of producing a zirconia diaphragm structure comprising a zirconia substrate having at least one window, and a zirconia diaphragm plate closing each of said at least one window at an open end of said each window, said method comprising the steps of:

preparing a zirconia green substrate having at least one window and containing a source material which gives, after firing of the green substrate, 0.1–5.0% by weight of one combination of materials selected from the group consisting of (i) alumina and calcia, (ii) alumina, calcia and magnesia, (iii) alumina, calcia and silica, and (iv) alumina, calcia, magnesia and silica;

preparing a zirconia green sheet;

laminating said zirconia green sheet on said zirconia green substrate to provide an integral green laminar structure in which said at least one window of said zirconia green substrate is closed by said zirconia green sheet; and firing said integral green laminar structure into an integral sintered body in the form of said zirconia diaphragm structure wherein said zirconia diaphragm plate formed by firing said zirconia green sheet provides at least one diaphragm portion which closes said at least one window of said zirconia substrate formed by firing said zirconia green substrate.

2. A method of producing a zirconia diaphragm structure according to claim 1, wherein said zirconia green sheet and said zirconia green substrate are formed of first and second zirconia materials, respectively, each material comprising partially stabilized zirconia or zirconia that is partially stabilized after firing thereof.

3. A method of producing a zirconia diaphragm structure according to claim 2, wherein said first zirconia material for said zirconia green sheet has an average particle size which is smaller than that of said second zirconia material for said zirconia green substrate.

4. A method of producing a zirconia diaphragm structure according to claim 3, wherein said first zirconia material for said zirconia green sheet has an average particle size of 0.05–0.5 μm, and wherein said second zirconia material for said zirconia green substrate has an average particle size of 0.1–1.0 μm.

5. A method of producing a zirconia diaphragm structure according to claim 1, wherein said zirconia green sheet has a thickness determined so that said at least one diaphragm portion has a thickness of not larger than 30 μm.

6. A method of producing a zirconia diaphragm structure according to claim 1, wherein said integral green laminar structure is fired at a temperature of 1200°–1600° C.

* * * * *